United States Patent

Mitin et al.

[11] Patent Number: 5,650,634
[45] Date of Patent: Jul. 22, 1997

[54] INTERCHANNEL NONEQUILIBRIUM CONFINED-PHONON EXCHANGE DEVICE

[75] Inventors: Vladimir V. Mitin, Birmigham; Viatcheslav Kochelap, Detroit; Rimvydas Mickevicius, Hamtramck, all of Mich.; Mitra Dutta, Tinton Falls, N.J.; Michael A. Stroscio, Durham, N.C.

[73] Assignee: The United States of America as represented by the Secretary of the Army, Washington, D.C.

[21] Appl. No.: 522,893

[22] Filed: Sep. 1, 1995

[51] Int. Cl.$^6$ .................................................. H01L 29/06
[52] U.S. Cl. .............................. 257/14; 257/12; 257/23; 257/9
[58] Field of Search ........................ 257/9, 12, 14, 257/15, 17, 23, 25

[56] References Cited

U.S. PATENT DOCUMENTS 5,264,711  11/1993  Dutta et al. .................. 257/14
5,289,013   2/1994  Goronkin ...................... 257/14
5,374,831  12/1994  Dutta et al. .................. 257/23

*Primary Examiner*—Minh-Loan Tran
*Attorney, Agent, or Firm*—Michael Zelenka; William H. Anderson

[57] ABSTRACT

A submatrix of semiconductor material contains plural electron conduction channels in either or both series and parallel arrangements. Electrons in the channels are confined by the submatrix and a surrounding main matrix provides photon confinement within the submatrix for nonequilibrium phonons which are mutually interchanged between channels. The confinement enhances the efficiency of energy and momentum transfer by means of nonequilibrium phonons. Embodiments of the invention as a transformer, bistable switch, controlled switch and amplifier are disclosed.

13 Claims, 3 Drawing Sheets

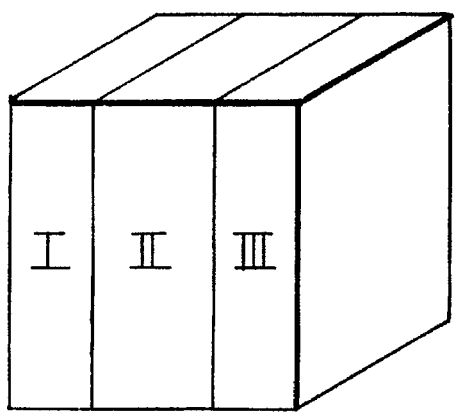
F I G. 1
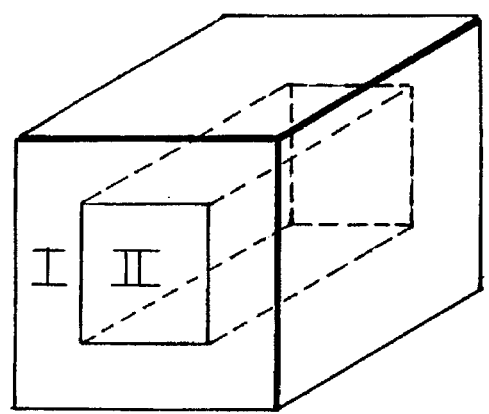
F I G. 2
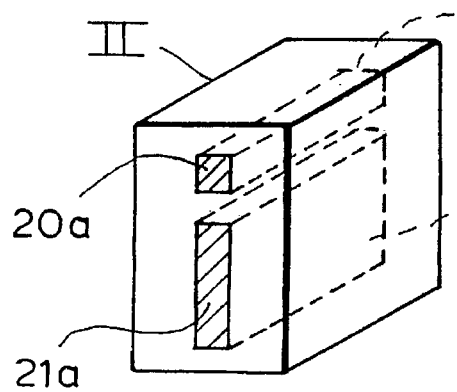
F I G. 3
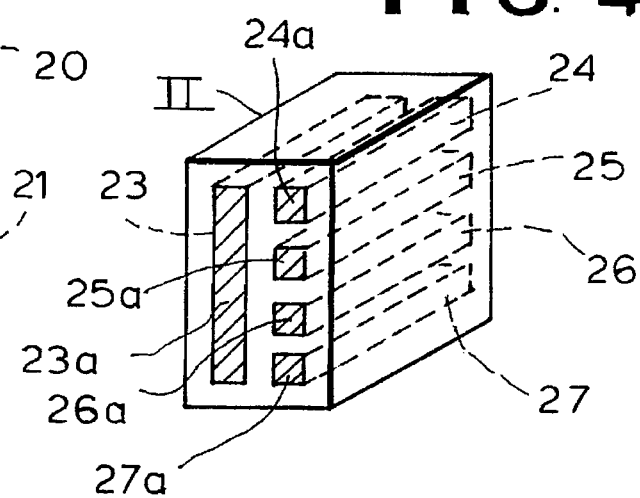
F I G. 4
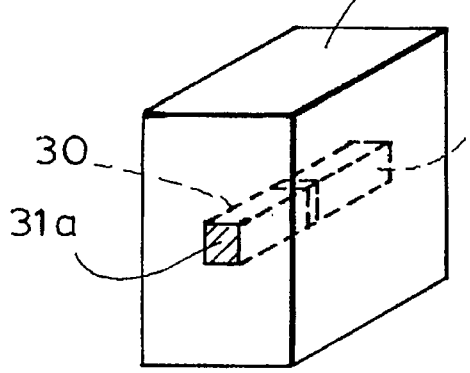
F I G. 5
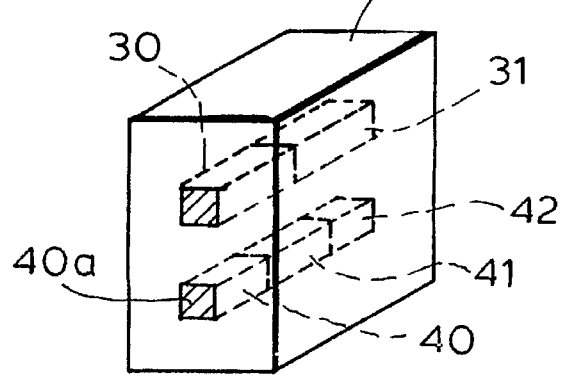
F I G. 6

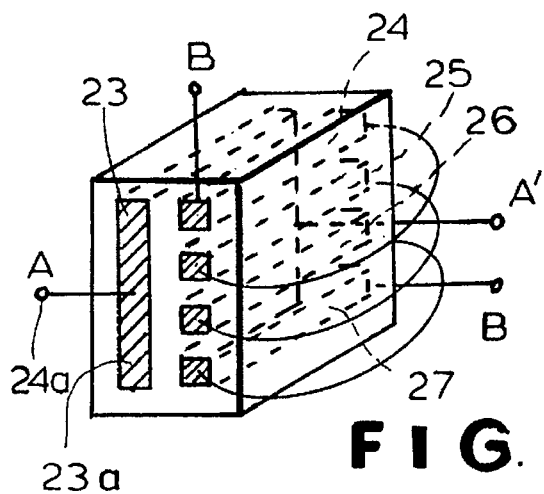
FIG. 7
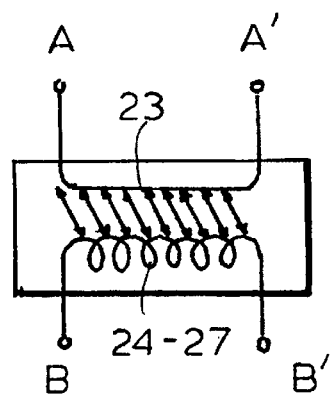
FIG. 7a
FIG. 8
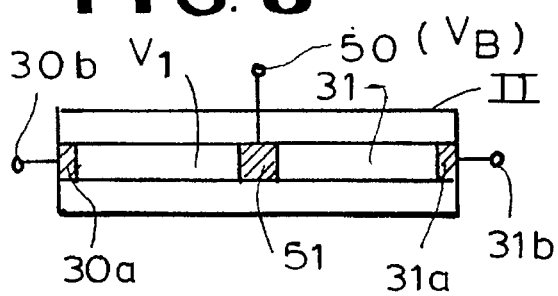
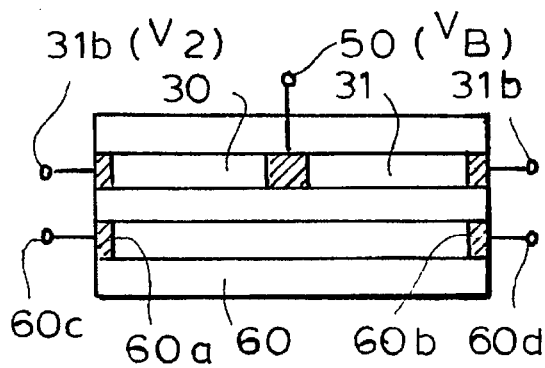
FIG. 9
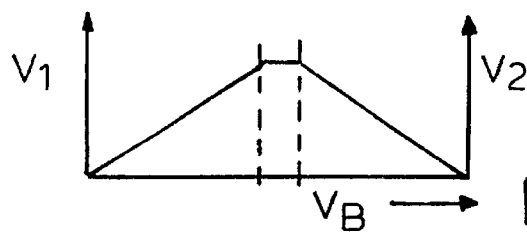
FIG. 8a
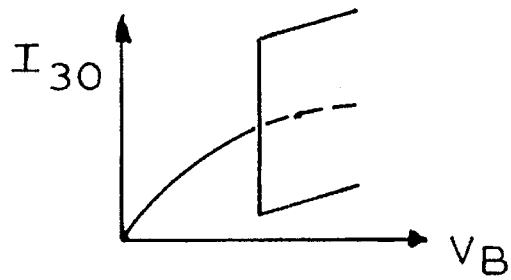
FIG. 8b
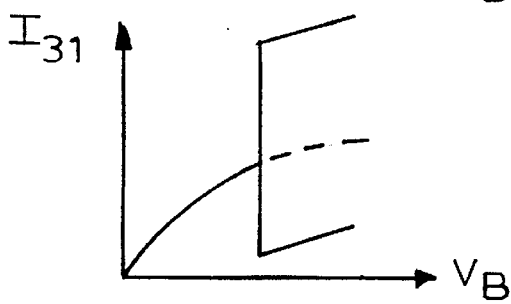
FIG. 8c

5,650,634

1

INTERCHANNEL NONEQUILIBRIUM CONFINED-PHONON EXCHANGE DEVICE

GOVERNMENT INTEREST

The invention described herein may be manufactured, used, imported and licensed by or for the Government of the United States of America without the payment to us of any royalties thereon.

FIELD OF THE INVENTION

This invention relates to solid state electronic devices, and more specifically relates to a novel control mechanism for controlling the electrical function of a solid state device by controlling interchannel exchange of nonequilibrium phonons.

BACKGROUND OF THE INVENTION

Phonon modulated switching devices are known, and are described in U.S. Pat. No. 5,374,831 entitled Quantum Well Phonon Modulator in the names of Mitra Dutta, et al., which is assigned to the assignee of the present invention and which is incorporated herein by reference. As disclosed in that patent, optical phonon emission from a first quantum well provides a scattering mechanism for electrons in an adjacent well, to reduce the current in the adjacent well.

SUMMARY OF THE INVENTION

In accordance with the present invention, a plurality of parallel spaced electron channels are embedded within a surrounding submatrix which at least partially is formed of semiconductor material. The submatrix, in turn, is surrounded by a matrix. Selected ones of the spaced channels may be formed of separate series-connected channels. The surrounding matrix provides phonon confinement to the submatrix for the various channels. An interchannel exchange of nonequilibrium phonons then provides a novel picosecond control mechanism of electrical functions due to electron and phonon quantization.

Phonon confinement can be obtained in any desired manner so long as the various electron channels can mutually exchange phonons. The novel structure of the invention can be employed to produce such varied devices as amplifiers, switches, oscillators and current and voltage transformers. Such devices will be insensitive to electrical conditions such as parasitic inductance, resistance and capacitance which hinder the performance of conventional high speed devices.

In general, the present invention provides a novel method to control electrical functions based on the confinement of phonons within a matrix containing electronic channels wherein the confinement enhances the efficiency of energy and momentum transfer by means of nonequilibrium phonons.

Other features and advantages of the present invention will become apparent from the following description of the invention which refers to the accompanying drawings.

BRIEF DESCRIPTION OF THE DRAWINGS

FIG. 1 is a perspective view of the principal structure of a matrix of the present invention.

FIG. 2 is a view like that of FIG. 1, showing another submatrix which may contain embedded channels.

FIG. 3 is a perspective view of the submatrix of FIG. 2 which contains parallel embedded electron conduction channels.

2

FIG. 4 is a view similar to that of FIG. 3 showing a different position for and a different number of parallel electron conduction channels.

FIG. 5 is a view similar to that of FIG. 3, showing two electron conducting channels in series with one another.

FIG. 6 is a view similar to that of FIG. 5, wherein two channels with series elements are formed in parallel with one another.

FIG. 7 shows the structure of FIG. 4 in which the channels are electronically connected to define transformer windings which are phonon coupled.

FIG. 7a is a circuit diagram of the structure of FIG. 7.

FIG. 8 is a cross-section of the structure of FIG. 5, showing electrical terminals and defining a bistable logic element.

FIG. 8a shows the potential distribution in the coupled channels of FIG. 8 for a symmetric load.

FIG. 8b shows the bistable I–V characteristics of a first of the series channels in FIG. 8.

FIG. 8c shows the bistable I–V characteristics of the second of the series channels in FIG. 8.

FIG. 9 is a cross-section of a structure like that of FIG. 8 which further contains a control channel to form a controlled switch.

Figure 10:
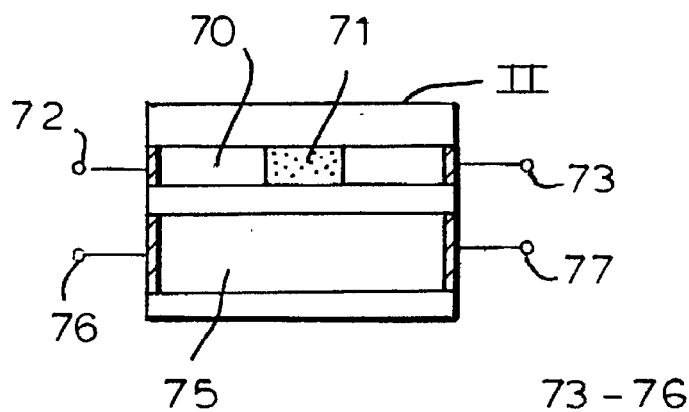

FIG. 10 is a cross-section of a structure containing channels arranged in parallel to form an amplifier.

Figure 11:
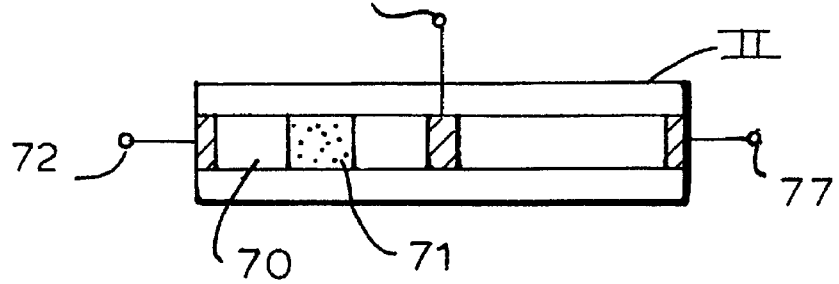

FIG. 11 is a cross-section of a structure containing channels arranged in series to form an amplifier.

Figure 12:
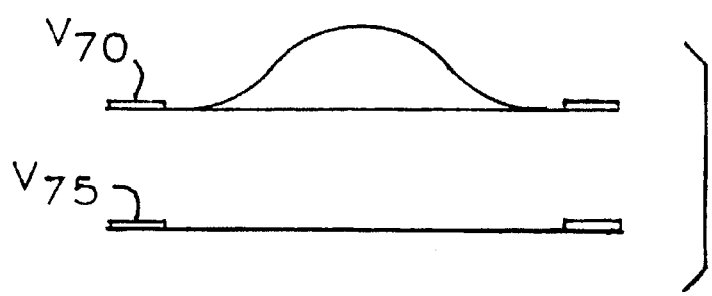

FIG. 12 shows the built-in distribution potential in selected channels in FIGS. 10 and 11.

Figure 13:
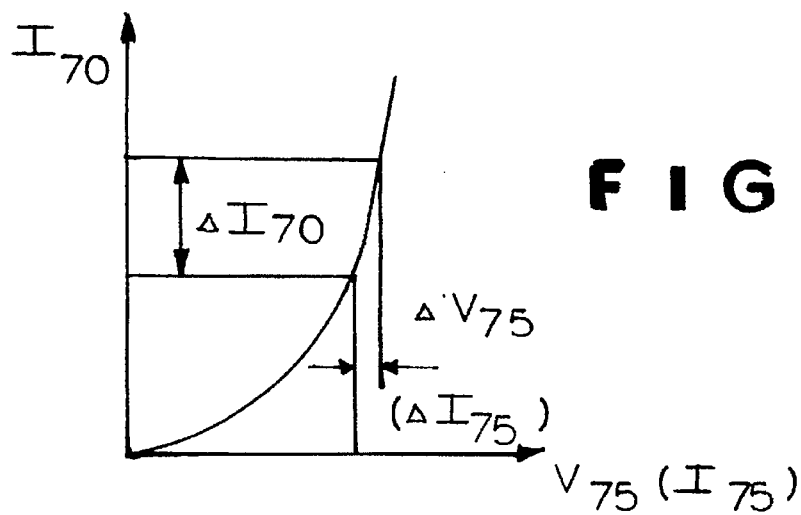

FIG. 13 shows the exponential I–V characteristic of the amplifiers of FIGS. 9 and 10.

DETAILED DESCRIPTION OF THE DRAWINGS

FIG. 1 shows the principal structures of the novel interchannel nonequilibrium confined-phonon exchange device. Thus, the main structures are the volumes I and III which provide a surrounding matrix of material which provide phonon confinement within volume II. Volumes I and III may be any material, with different phonon frequencies from those in volume II. The dimensions of volumes I and III, concentration of charge carriers and the selected impurities in these volumes may vary depending on the application for which the invention will be used. However, depending on the application, those skilled in the art would know what physical parameters to select given the present specification.

Volumes I and III may also be simply free space for a free standing structure.

Volume II shows the volume or submatrix in which electron channels are embedded, surrounded by matrix I. Similar to Volume II, submatrix II of FIGS. 1 and 2 may be any semiconductor material which is different from the materials of volumes I and III. With respect to the dimensions of submatrix II, at least one dimension of the cross-section of this submatrix should not exceed several hundred nanometers.

In both of the embodiments of FIGS. 1 and 2, phonons are confined within submatrix II to enhance interchannel coupling between electron channels within submatrix II to be described.

FIG. 3 shows submatrix II in perspective view, and shows two electron channels 20 and 21 extending through the submatrix. Channels 20 and 21 may be any semiconductor material with phonon frequencies similar to those in surrounding submatrix II, but with a different forbidden energy bond gap than selected for submatrix II. The lengths of channels 20 and 21 may be any dimension, depending on the application. However, at least one dimension of the cross sections of channels 20 and 21 should not exceed 100 nanometers and the spacing between channels 20 and 21 should be in the range of approximately 1 to 20 nanometers. As those skilled in the art will appreciate, it will be desirable to have an impurity and/or defect concentration as low as possible in these channels 20 and 21. While channels 20 and 21 are shown as square in cross-section, any desired cross-sectional shape can used.

Each of channels 20 and 21 receive contact metallizing at their opposite ends, at the exterior of volume II (or I) shown as metal contacts 20a and 21a respectively in FIG. 3. Identical contacts will be placed on the opposite ends of channels 20 and 21, which are not seen in FIG. 3. In operation, nonequilibrium phonons exchanged between channels 20 and 21 will modulate the electron current in the other channel.

FIG. 4 shows another geometry for parallel channels 23 to 27. As will be described in connection with FIGS. 7 and 7a, the structure of FIG. 4 can be used to define a transformer. Contacts 23a to 27a are formed by metallizing the ends of channels 23 to 27a respectively as shown. Similar contacts will be applied to the opposite ends of channels 23 to 27, not seen in FIG. 4.

While FIGS. 3 and 4 show parallel electron channels, it is also possible to arrange the electron channels serially, as shown in FIG. 5. Thus, two channels 30 and 31 may be connected in series within the submatrix II. Channel 30 has a contact 31a at its one end and is connected to channel 31 at its other end. Channel 31 is metallized at its opposite end, not seen.

Channels 30 and 31 may be formed by one of three ways. First, the channels 30 and 31 may be formed by two different materials with different energy band gaps but similar optical phonon frequencies. Second, channels 30 and 31 may be formed from the same material, but the channels are separated by a spacer which is transparent to phonons and which is opaque to charge carriers. Third, channels 30 and 31 may also be formed from one homogeneous channel (as opposed to two separate channels) wherein the charge carrier separation is accomplished by means of applying an electrostatic potential to a central electrical contact(s) attached to one, two, three or all four side walls of the homogeneous channel.

As shown in FIG. 6, series-arranged channels 30 and 31 can be arranged in parallel with other channels, shown as series channels 40, 41 and 42. Contact 40a is also shown in FIG. 6.

Channels 40, 41, 42 have the same structure as channels 30 and 31 of FIGS. 5 and 6; the only difference is that there are three channels connected in series instead of two channels. The number of channels in series will, as those skilled in the art will recognize, depend on the application of the structure. The spacing of the channels in series will range from one atomic layer to approximately 20 nanometers.

FIG. 7 shows the manner in which the structure of FIG. 4 can be arranged to form a transformer. FIG. 7a is an equivalent circuit of the transformer. In FIG. 7, electron channel 23 is connected to terminals A and A' at its opposite respective ends. The channels 24 to 27 (any desired number can be used) are connected in a series coil form by external wiring connected to the terminals B and B'. The external winding can be formed by conductive traces on the exterior semiconductor body.

The structure of FIGS. 7 and 7a operates as follows:

An input voltage $_{AA}$ is applied to contacts AA'. This induces an output voltage $V_{BB}$ at terminals BB', which is related to $V_{AA}$ by the relationship: $V_{BB}=YNV_{AA}$, where Y is the efficiency of Interchannel Phonon Coupling and N is the number of electron channels in the output circuit. Due to effective phonon coupling in the structure and assuming N>1, $V_{BB}>V_{AA}$, i.e., the device serves as a step-up voltage transformer. The interchange of input and output connections makes it possible to get greater current in the AA' circuit than that applied to BB' circuit, so that the device can also serve as a step-up current transformer. In contrast to transformers operating by magnetic field flux, the transformer of FIG. 7 operates not only in AC but also in DC regimes.

FIG. 8 shows the manner in which the device of the invention can be arranged to define a bistable logic element. Thus, the structure of FIG. 5 can be employed with the contacts 30a and 31a connected to terminal electrodes 30b and 31b, respectively. A control terminal 50 is connected to the connection region 51 between conduction channels 30 and 31.

FIG. 8a shows the potential distribution in the coupled channels 30 and 31 for a symmetric load. As shown, the voltages $V_1$ and $V_2$ can be switched from high to low and from low to high by varying the control voltage $V_B$.

FIGS. 8b and 8c show the bistable current-voltage characteristics for the device of FIG. 8, as the control voltage $V_B$ varies. Thus currents $I_{30}$ and $I_{31}$ through channels 30 and 31 respectively switch as shown.

The structure of FIG. 8 can be modified by adding a parallel channel 60 having metallized contacts 60a and 60b at its opposite ends as shown in FIG. 9. Terminals 60c and 60d are connected to contacts 60a and 60b respectively. The added coupled channel 60 enables the device of FIG. 9 to operate as a controlled switch between terminals 60c and 60d.

In operation, the voltage applied to terminals 60c and 60d controls the current in channel 60 and thus the generated flux of nonequilibrium phonons. If this voltage is non-zero, then the phonon system in the structure becomes asymmetric and leads to the switching of the device to one of the bistable branches. Depending on the direction of current in channel 60, either channel 30 or channel 31 can be closed, i.e., switched into a low-current regime.

FIG. 10 shows a channel arrangement in submatrix II which creates an amplifier device. Thus, a first channel 70 is provided which contains a potential barrier 71. Channel 70 has end contacts and terminals 72 and 73. A parallel channel 75 has terminals 76 and 79.

The structure of FIG. 10 is similar to that of FIG. 9. The only difference is that channel 70 contains a potential barrier 71 for charge carriers. This potential barrier 71 can be created either by an electrostatic potential applied to the central contact 50 as in FIG. 9 or by a spacer of semiconductor material with a different energy band gap than and similar optical phonon frequencies as in the material of channel 70. The length of this spacer should range from approximately 10 to 100 nanometers.

It should be noted that the structure of FIG. 10 could be carried out as on in series structure, as shown in FIG. 11.

FIG. 12 shows the potential distributions $V_{70}$ and $V_{75}$ along channels 70 and 75, respectively in FIGS. 10 and 11.

Note the built-in barrier existing in voltage $V_{70}$ due to the barrier 71. FIG. 13 shows the I-V characteristic for the device, and shows its operation as an amplifier.

The device operation is as follows:

Channel 70 contains a finite potential barrier (shaded area 71) for electrons moving along the channel 70. AC current applied to channel 75 generates a time-modulated nonequilibrium phonon population. Nonequilibrium phonons provide modulation of the electron gas temperature in channel 70. This results in current modulation in channel 70. Due to presence of the potential barrier in channel 70, the modulation depth of current $I_1$ in this channel exceeds modulation depth of current $I_{75}$ in channel 2. Thus, the device of either FIGS. 10 or 11 serves as AC current amplifier. That is, a small change $\Delta I_{75}$ in current $I_{75}$ will produce a large change $\Delta I_{70}$ in current $I_{70}$.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An interchannel nonequilibrium confined-phonon exchange device, comprising a matrix volume; a submatrix volume contained within said matrix volume; at least first and second electron conduction channels disposed within said submatrix and defining respective conduction paths of confined cross-sectional area; said first and second channels being disposed relative to one another to exchange nonequilibrium phonons; said nonequilibrium phonons being confined within said submatrix.

2. The device of claim 1 wherein said first and second channels have spaced parallel axes.

3. The device of claim 2 which includes at least one potential barrier in at least one of said channels.

4. The device of claim 2 which includes a third channel disposed in series with said first channel and being coaxial with said first channel.

5. The device of claim 2 wherein said first and second channels are coextensive with one another.

6. The device of claim 5 wherein said first and second channels define series-connected portions of an electrical transformer winding.

7. The device of claim 2 wherein said first and second channels define series-connected portions of an electrical transformer winding.

8. The device of claim 1 wherein said first and second channels are connected in series and extend along a common axis.

9. The device of claim 8 which includes at least one potential barrier in at least one of said channels.

10. The device of claim 8 which includes a third channel disposed in parallel with said first and second channels.

11. The device of claim 10 wherein said first and second channels are coextensive with said third channel.

12. The device of claim 10 which includes a control electrode connected at the juncture between said first and second channels.

13. The device of claim 8 which includes a control electrode connected at the juncture between said first and second channels.

* * * * *